United States Patent [19]
Bruwer et al.

[11] Patent Number: 5,768,208
[45] Date of Patent: Jun. 16, 1998

[54] FAIL SAFE NON-VOLATILE MEMORY PROGRAMMING SYSTEM AND METHOD THEREFOR

[75] Inventors: Frederick J. Bruwer, Chandler; Emile Van Rooyen; Willem Smit, both of Phoenix; Thomas C. Salt, Chandler, all of Ariz.

[73] Assignee: Microchip Technology Incorporated, Chandler, Ariz.

[21] Appl. No.: 665,697

[22] Filed: Jun. 18, 1996

[51] Int. Cl.$^6$ .................................................. G11C 7/00
[52] U.S. Cl. ................ 365/228; 365/229; 365/185.04; 365/185.08; 365/189.05
[58] Field of Search .......................... 365/228, 229, 365/185.04, 185.08, 189.05

[56] References Cited

U.S. PATENT DOCUMENTS

| | | | |
|---|---|---|---|
| 4,823,323 | 4/1989 | Higuchi | 365/228 |
| 5,007,027 | 4/1991 | Shimoi | 365/229 |
| 5,430,402 | 7/1995 | Tedrow et al. | 327/530 |
| 5,438,549 | 8/1995 | Levy | 365/229 |

*Primary Examiner*—David C. Nelms
*Assistant Examiner*—Hien Nguyen
*Attorney, Agent, or Firm*—Harry M. Weiss; Jeffrey D. Moy; Harry M. Weiss & Associates, P.C.

[57] ABSTRACT

The present invention relates to a fail safe non-volatile memory programming system. The system uses a high voltage charging capacitor to store a charge for programming a memory device. A second charging capacitor is used for supplying power to the control logic used for programming the memory device. If power is removed during a programming cycle, the charge stored in the two capacitors is sufficient to complete the programming cycle.

22 Claims, 2 Drawing Sheets

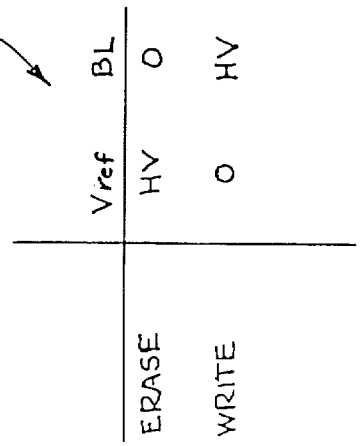
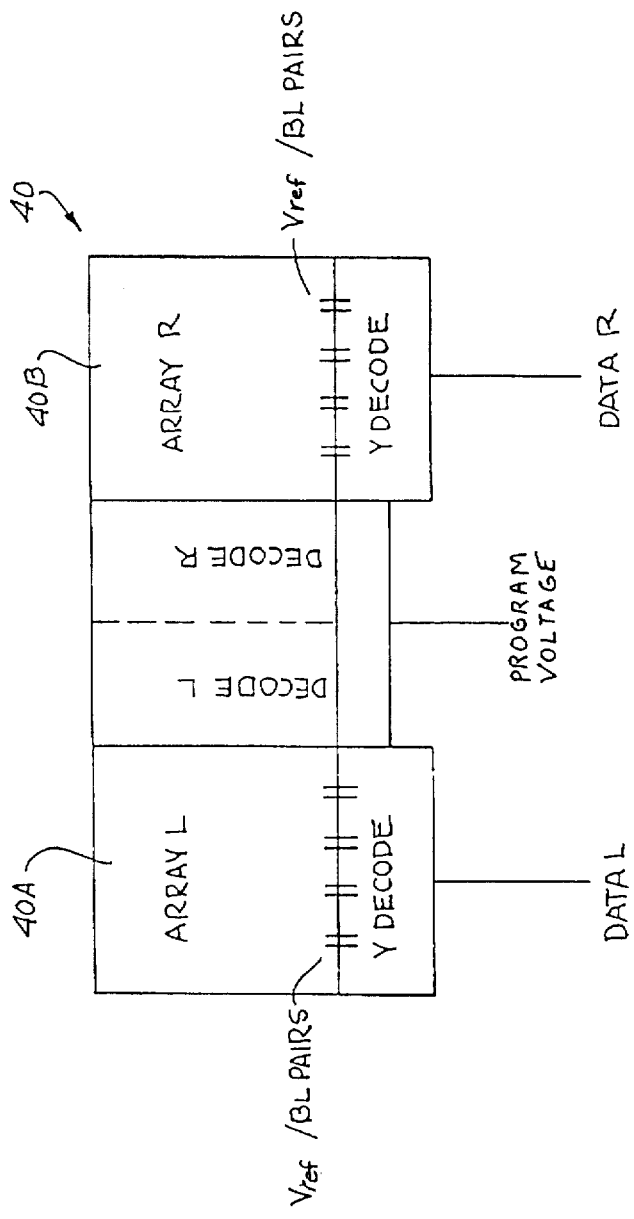
FIG. 2
FIG. 2B

FAIL SAFE NON-VOLATILE MEMORY PROGRAMMING SYSTEM AND METHOD THEREFOR

BACKGROUND OF THE INVENTION

1. Field of the Invention

This invention relates to memory integrated circuit (IC) chips and, more specifically, to a system and a method for providing a fail safe non-volatile memory write to a memory IC chip.

2. Description of the Prior Art

In non-volatile memory, for example Electrical Erasable Programmable Read Only Memory (EEPROM), an uncertainty is always created if a power failure occurs at the time of the actual recording of information into the memory. When power is applied again, it is normally not possible to tell if a specific write was 100 percent completed or not at all attempted. Furthermore, a "soft write" may have occurred. A soft write is when an attempt is made to change the state of information in a cell of the memory but the attempt is not fully completed due to the untimely power failure or other type of interrupt. This could result in a cell that may switch values due to changes in time, temperature, voltage, or other types of variables. This creates a very undesirable situation since the information stored in memory is volatile (i.e., the information stored in memory may change without notice).

The above problem is exacerbated by the standard procedure used for writing a binary value into a memory word. When writing a binary value into a memory word, all the bits in the word are written to a one "1" state. The bits that are not supposed to be in a one "1" state are then changed to a zero "0" state. The above procedure may also function in an opposite manner wherein all the bits in the word are written to a zero "0" state and the bits that are not supposed to be in a zero "0" state are then changed to a one "1" state. The standard procedure for writing a binary value into a word results in a two step write process with a finite time between the first write and the second write. Although the time frame between write steps may be short (i.e., a few milliseconds), any problem stopping the process between the two write stages will result in a permanent loss of information since neither the new value nor the old value will be stored in the non-volatile memory. This can cause serious complications in applications involving the addition or the deduction of money, for example, in smart card applications.

In order to avoid the writing of binary values into a memory word, an abacus structure was implemented. In the abacus structure, as units get deducted the bits in one level of the abacus get erased one by one. This avoids the danger of a total lost word. At most, a specific bit may be written into "softly", which is not a serious problem since only one bit (or token) is effected. However, when a full level is depleted, an arithmetic "borrow" or binary "carry" operation must be performed. This requires a bit on one level above to be deducted and a full level below restored. This again is a two phase operation resulting in a danger that money may be lost or gained in smart card applications.

Therefore, a need existed to provide a fail safe non-volatile memory write system. The system must eliminate soft writes to the non-volatile memory and uncompleted writes with low integrity. The system must also eliminate the two phase write operation which may be interrupted between stages resulting in the loss of information. The system must have the ability to complete a write operation to the non-volatile memory even if power supplied to the non-volatile memory has been interrupted. Furthermore, in smart card and monetary value applications, security against the misuse of this system to prevent the unauthorized loading of money is required without requiring external actions to be implemented. Presently, a method to prevent the loss of information has been implemented using special bits that require actions external to the memory chip to be undertaken.

SUMMARY OF THE INVENTION

In accordance with one embodiment of the present invention, it is an object of the present invention to provide a fail safe non-volatile memory write system.

It is another object of the present invention to provide a fail safe non-volatile memory write system that eliminates soft writes to the non-volatile memory and uncompleted writes with low integrity.

It is still another object of the present invention to provide a fail safe non-volatile memory write system that eliminates two phase write operations which may be interrupted between stages resulting in the loss of information.

It is still another object of the present invention to provide a fail safe non-volatile memory write system that has the ability to complete a write operation to the non-volatile memory even if external power to the non-volatile memory system has been interrupted.

It is still another object of the present invention to provide a fail safe non-volatile memory write system that has the ability to complete a write operation to the non-volatile memory array that is more size efficient when compared to an abacus structure.

It is still another object of the present invention to complete a write operation to different words in the non-volatile memory in a write cycle needing only a single high voltage pulse.

BRIEF DESCRIPTION OF THE PREFERRED EMBODIMENTS

In accordance with one embodiment of the present invention a fail safe non-volatile memory programming system is disclosed. The system is comprised of non-volatile memory means for storing information. First charging capacitor means are coupled to the non-volatile memory means and to high voltage supply or generation means for storing a charge and for supplying a programming voltage to the non-volatile memory means. High voltage generator means are coupled to the first charging capacitor means for charging the first charging capacitor means. Sensor means are coupled to the first charging capacitor means for monitoring the charge stored in the first charging capacitor means. Control means are used in the non-volatile memory system means for receiving an external signal to program the non-volatile memory means and for sending a signal to program a desired address location in the non-volatile memory means with information when the sensor means indicates that the charge stored in the first charging capacitor means has reached a threshold level, the threshold level indicating a charge stored in the first capacitor means sufficient to program the desired address location in the non-volatile memory means even when an external power supply is removed from the non-volatile memory system means. Second charging capacitor means are coupled to the control means for providing an independent backup source of power to the control means should the normal power supply source be interrupted. Latching means are coupled to the control means for receiving the desired address location in the non-volatile memory means to be programmed and for transferring the information to the desired address location.

In accordance with another embodiment of the present invention, a method of providing a fail safe non-volatile memory programming system is disclosed. The method is comprised of the steps of: providing non-volatile memory means for storing information; providing first charging capacitor means coupled to the non-volatile memory means for storing a charge for supplying a programming voltage to the non-volatile memory means; providing high voltage generator means coupled to the first charging capacitor means for charging the first charging capacitor means; providing latching means coupled to the control means for receiving the desired address location in the non-volatile memory means to be programmed and for transferring the information to be programmed to the desired address location; providing sensor means coupled to the first charging capacitor means for monitoring the charge stored in the first charging capacitor means; providing control means coupled to the non-volatile memory means for receiving an external signal to program the non-volatile memory means and for sending a signal to program a desired address location in the non-volatile memory means with information only when the sensor means indicates that the charge stored in the first charging capacitor means has reached a threshold level, the threshold level indicating a charge stored in the first capacitor means sufficient to program the desired address location in the non-volatile memory means even when an external power supply is removed from the non-volatile memory system means; and providing second charging capacitor means coupled to the control means for providing an independent backup source of power to the control means and to the latching means should the normal power supply source fail.

In the embodiments described above, the non-volatile memory means can be an EEPROM, FRAM, or any other non-volatile memory means requiring a voltage to be program. The two charging capacitors may be any type of formal on chip energy storage structure.

The foregoing and other objects, features, and advantages of the invention will be apparent from the following, more particular, description of the preferred embodiments of the invention, as illustrated in the accompanying drawings.

BRIEF DESCRIPTION OF THE DRAWINGS

FIG. 2 is a simplified block diagram of a non-volatile dual array memory device for use with the fail safe non-volatile memory programming system depicted in FIG. 1.

FIG. 2B is a table showing the different programming voltages for writing to and erasing information in the non-volatile dual array memory device depicted in FIG. 2.

DETAILED DESCRIPTION OF THE PREFERRED EMBODIMENT

Figure 1:
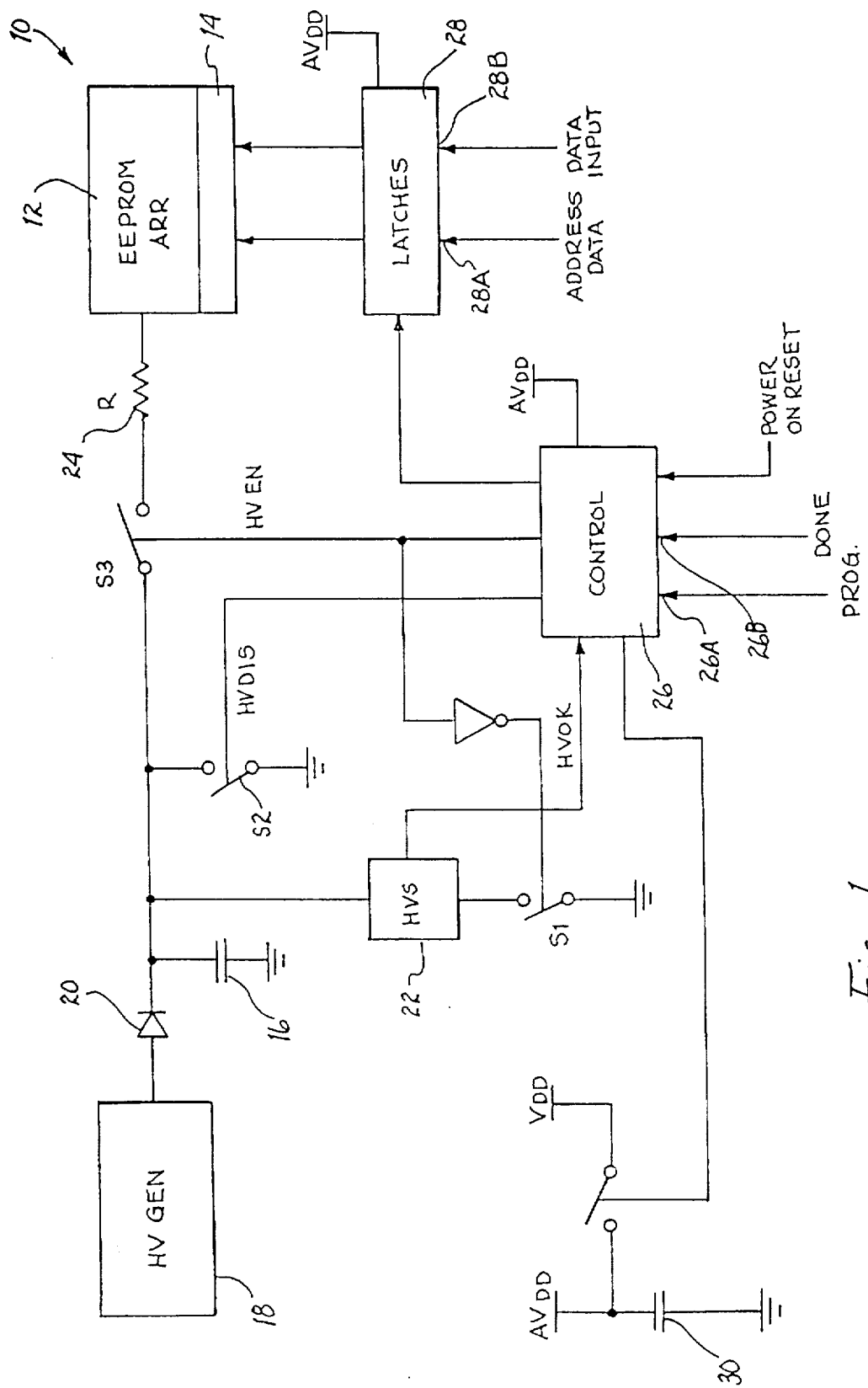
FIG. 1 is a simplified block diagram of a fail safe non-volatile memory programming system of the present invention.

Referring to FIG. 1, a fail safe non-volatile memory programming system 10 (hereinafter system 10) is shown. The system 10 is comprised of a non-volatile memory device 12. In one embodiment of the present invention, the non-volatile memory device 12 is an Electrical Erasable Programmable Read Only Memory (EEPROM). However, it should be noted that the system 10 can be applied to other non-volatile memory structures. The non-volatile memory device 12 is used for storing binary information. The non-volatile memory device 12 uses a GRAY code counter 14 for storing the binary information. In the preferred embodiment of the present invention, a four bit GRAY code counter is used. The GRAY code counter 14 is a positional binary notational counter in which any two numbers whose difference is one are represented by binary expressions that are the same except in one bit position. The GRAY code counter reduces the amount of space required in the non-volatile memory device 12 for storing an equivalent amount of information as compared to using an abacus scheme. However, the GRAY code counter still has most of the advantages of the abacus scheme since there is only a one bit change for consecutive numbers.

A high voltage charging capacitor 16 is coupled to the non-volatile memory device 12. The high voltage charging capacitor 16 is used for storing a charge that must be sufficient before the non-volatile memory 12 is to be programmed (i.e. write to or erase the non-volatile memory device 12). The high voltage charging capacitor 16 is then used for supplying a programming voltage to the non-volatile memory device 12.

A current limiting device 24 is coupled between the high voltage charging capacitor 16 and the non-volatile memory device 12. The current limiting device 24 is used for limiting the current used by the non-volatile memory device 12 during programming thus creating a controlled upward voltage slope. The current limiting device 24 may be a resistor measuring a few mega-ohms or a current source of some kind which supplies a current of the desired value. If a current source is used, the current source needs to be controlled from an external supply for its proper operation and will therefore not function properly if the external supply fails. The current source also must not consume too much energy from the low voltage charging capacitor 30. It is therefore necessary that a normally open switch needs to be coupled in parallel with the current source and that the switch be closed when the external power fails, resulting in a very fast transfer of energy. If the current source consumes too much energy, it will require the low voltage charging capacitor 30 to be very large.

The high voltage charging capacitor 16 is charged by a high voltage generator 18 through a diode device 20. In the preferred embodiment of the present invention, the high voltage generator 18 is a charge pump which generates a high voltage charge. The diode device 20 is used for limiting feedback to the high voltage generator 18 to prevent discharging of the high voltage charging capacitor 16 through that route.

A high voltage sensing device 22 is coupled to the high voltage charging capacitor 16. The high voltage sensing device 22 monitors the charge stored in the high voltage charging capacitor 16. When the high voltage charging capacitor 16 reaches a threshold level, the high voltage sensing device 22 sends a signal to a control unit 26 indicating that the high voltage charging capacitor 16 has a sufficient charge to program the non-volatile memory device 12.

When a program command is given to the non-volatile memory device 12 by an external device (like a pay telephone in the case of a prepaid chip phone card), the sensing of a sufficient charge in the capacitor 16 defines a point of no return. If power fails in any way before this point, the whole programming process is abandon without any attempted write to the memory device 12. However, should a sufficient charge be detected, the card with a fail safe non-volatile memory programming system 10 can be removed and the write process would be completed successfully.

In order to program the non-volatile memory device 12, a switch S3 must be closed by the control unit 26. The closing of the switch S3 also allows for the programming voltage from the high voltage capacitor 16 to be supplied to the non-volatile memory device 12. It should be noted that if the charge stored in the high voltage charging capacitor 16 is not sufficient to program the non-volatile memory device 12, the programming sequence is never started by the control unit 26. The switches S2 and S3 are closed at the end of a programming cycle and at start-up to precondition the high voltage charging capacitor 16.

A switch S1 is also provided in the system 10. The switch S1 is provided in order to isolate the high voltage sensing device 22 during programming of the non-volatile memory device 12 in order to prevent energy loss.

When the control unit 26 receives a signal at its programming input 26A, the control unit 26 sends a signal to a latching device 28. The address and data information is loaded into the latching device 28 at inputs 28A and 28B respectively, and the new data is transferred to the desired address in the non-volatile memory device 12. A signal will then be sent to an input 26B of the control unit 26 indicating when the programming cycle is complete.

The control unit 26 and the latching device 28 are powered by an analog voltage supply $AV_{dd}$. In the preferred embodiment of the present invention, the analog voltage supply $AV_{dd}$ provides a 5 volt charge. If the analog voltage supply $AV_{dd}$ is interrupted, a low voltage charging capacitor 30 is provided to supply the required power to the control unit 26 and the latching device 28 in order to complete the programming cycle. In another embodiment of the present invention, the high voltage charging capacitor 16 is also coupled to a latching device 28. The high voltage charging capacitor 16 thus is able to supply power to the latching device 28 so that the latching device 28 does not have to depend on the analog voltage source $AV_{dd}$. In such an implementation, the high voltage charging capacitor 16 will normally be connected to an external voltage source $V_{DD}$ while the high voltage generator 18 is not functioning.

In accordance with another embodiment of the present invention, the non-volatile memory device 12 is split into two separate arrays. Referring to FIGS. 2 and 2B, a dual array non-volatile memory device 40 is shown. The dual array non-volatile memory device 40 is split into a left array 40A and a right array 40B wherein one of the arrays will hold even addresses and the other array will hold odd addresses. Each of the arrays 40A and 40B have a plurality of signal line pairs $V_{ref}/B_L$. The signal line pairs $V_{ref}/B_L$ allow both of the arrays 40A and 40B of the dual array non-volatile memory device 40 to be simultaneously programmed. As can be seen from the table 50 shown in FIG. 2B, by changing the voltages on the signal line pairs $V_{ref}/B_L$, one is able to write or erase information to each of the arrays 40A and 40B.

The dual array non-volatile memory device 40 enables an erase with carry or borrow application to be completed in a single programming cycle. This is important since a single programming charge is stored and once discharged it cannot be guaranteed in all applications to be recharged to complete the operation. This is required when an abacus structure is used and a higher order bit is "erased" before a lower order "row" can be replenished.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A fail safe non-volatile memory programming system comprising, in combination:

non-volatile memory means for storing information;

first charging capacitor means coupled to said non-volatile memory means for storing a charge for supplying a programming voltage to said non-volatile memory means;

control means coupled to said non-volatile memory means for receiving an external signal to program said non-volatile memory means and for sending a signal to program a desired address location in said non-volatile memory means with information when said control means monitors a signal that indicates that a value of said charge stored in said first charging capacitor means can completely program said desired address location in said non-volatile memory means with said information even when an external power supply is removed from said non-volatile memory means; and second charging capacitor means coupled to said control means for providing a source of power to said control means.

2. A fail safe non-volatile memory programming system in accordance with claim 1 further comprising sensor means coupled to said first charging capacitor means for monitoring said charge stored in said first charging capacitor means.

3. A fail safe non-volatile memory programming system in accordance with claim 1 further comprising high voltage generator means coupled to said first charging capacitor means for charging said first charging capacitor means.

4. A fail safe non-volatile memory programming system in accordance with claim 1 further comprising latching means coupled to said control means for receiving said desired address location in said non-volatile memory means to be programmed and for transferring said information to said desired address location.

5. A fail safe non-volatile memory programming system in accordance with claim 1 further comprising resistance means coupled to said non-volatile memory means for controlling a voltage slew rate to said non-volatile memory means.

6. A fail safe non-volatile memory programming system in accordance with claim 1 further comprising current source means coupled to said non-volatile memory means for controlling a voltage slew rate to said non-volatile memory means.

7. A fail safe non-volatile memory programming system in accordance with claim 1 further comprising:

first switching means coupled to said first charging capacitor means and to said control means for providing said programming voltage from said first charging capacitor means to said non-volatile memory means; and second switching means coupled to said first charging capacitor means and to said control means for discharging said first charging capacitor means and said non-volatile memory means when a programming cycle to said non-volatile memory means is completed.

8. A fail safe non-volatile memory programming system in accordance with claim 3 further comprising diode means coupled to said high voltage generator means and to said first charging capacitor means for limiting feedback to said high voltage generator means to prevent discharging of said first charging capacitor means.

9. A fail safe non-volatile memory programming system in accordance with claim 1 wherein said non-volatile memory means is an Electrical Erasable Programmable Read Only Memory (EEPROM).

10. A fail safe non-volatile memory programming system in accordance with claim 1 wherein said non-volatile memory means comprises a GRAY code counter implementation means for storing information.

11. A fail safe non-volatile memory programming system in accordance with claim 10 wherein said GRAY code counter implementation means is a four bit GRAY code counter.

12. A fail safe non-volatile memory programming system in accordance with claim 1 wherein said non-volatile memory means comprises:
- a first array containing even addresses of said non-volatile memory means; and
- a second array containing odd addresses of said non-volatile memory means.

13. A fail safe non-volatile memory programming system in accordance with claim 12 wherein elements of both said first array and said second array of said non-volatile memory means are simultaneously programmed with information.

14. A fail safe non-volatile memory programming system comprising, in combination:
- non-volatile memory means for storing information;
- four bit GRAY code counter implementation means for storing information in said non-volatile memory means;
- first charging capacitor means coupled to said non-volatile memory means for storing a charge for supplying a programming voltage to said non-volatile memory means;
- high voltage generator means coupled to said first charging capacitor means for charging said first charging capacitor means;
- diode means coupled to said high voltage generator means and to said first charging capacitor means for limiting feedback to said high voltage generator means to prevent discharging of said first charging capacitor means;
- sensor means coupled to said first charging capacitor means for monitoring said charge stored in said first charging capacitor means;
- control means coupled to said non-volatile memory means for receiving an external signal to program said non-volatile memory means and for sending a signal to program a desired address location in said non-volatile memory means with information when said sensor means indicates that said charge stored in said first charging capacitor means has reached a threshold level indicating that said charge stored in said first capacitor means is sufficient to program said desired address location in said non-volatile memory means with said information even when an external power supply is removed from said non-volatile memory means;
- current limiting means coupled to said non-volatile memory means and to said high voltage generator means for controlling a voltage slew rate to said non-volatile memory means;
- latching means coupled to said control means for receiving said desired address location in said non-volatile memory means to be programmed and for transferring said information to said desired address location;
- second charging capacitor means coupled to said control means for providing a source of power to said control means and to said latching means;
- first switching means coupled to said first charging capacitor means and to said control means for providing said programming voltage from said first charging capacitor means to said non-volatile memory means; and
- second switching means coupled to said first charging capacitor means and to said control means for discharging said first charging capacitor means and said non-volatile memory means when a programming cycle to said non-volatile memory means is completed.

15. A fail safe non-volatile memory programming system in accordance with claim 14 wherein said current limiting means is a resistor.

16. A fail safe non-volatile memory programming system in accordance with claim 14 wherein said current limiting means is a current source.

17. A fail safe non-volatile memory programming system in accordance with claim 14 wherein said non-volatile memory means is an Electrical Erasable Programmable Read Only Memory (EEPROM).

18. A fail safe non-volatile memory programming system in accordance with claim 14 wherein said non-volatile memory means comprises a first array containing even addresses of said non-volatile memory means and a second array containing odd addresses of said non-volatile memory means wherein both of said first array and said second array of said non-volatile memory means are simultaneously programmed with information.

19. A method of providing a fail safe non-volatile memory programming system comprising the steps of:
- providing non-volatile memory means for storing information;
- providing first charging capacitor means coupled to said non-volatile memory means for storing a charge for supplying a programming voltage to said non-volatile memory means;
- providing high voltage generator means coupled to said first charging capacitor means for charging said first charging capacitor means;
- providing sensor means coupled to said first charging capacitor means for monitoring said charge stored in said first charging capacitor means;
- providing control means coupled to said non-volatile memory means for receiving an external signal to program said non-volatile memory means and for sending a signal to program a desired address location in said non-volatile memory means with information when said sensor means indicates that said charge stored in said first charging capacitor means has reached a threshold level indicating that said charge stored in said first capacitor means is sufficient to program said desired address location in said non-volatile memory means with said information even when an external power supply is removed from said non-volatile memory means;
- providing latching means coupled to said control means for receiving said desired address location in said non-volatile memory means to be programmed and for transferring said information to said desired address location; and
- providing second charging capacitor means coupled to said control means for providing a source of power to said control means and to said latching means.

20. The method of claim 19 further comprising the steps of:

provising current limiting means coupled to said non-volatile memory means and to said high voltage generator means for controlling a voltage slew rate to said non-volatile memory means;

providing first switching means coupled to said first charging capacitor means and to said control means for providing said programming voltage from said first charging capacitor means to said non-volatile memory means;

providing second switching means coupled to said first charging capacitor means and to said control means for discharging said first charging capacitor means and said non-volatile memory means when a programming cycle is completed to said non-volatile memory means; and providing diode means coupled to said high voltage generator means and to said first charging capacitor means for limiting feedback to said high voltage generator means to prevent discharging of said first charging capacitor means.

21. The method of claim 20 wherein said step of providing non-volatile memory means further comprises the step of providing four bit GRAY code counter implementation means for storing information in said non-volatile memory means.

22. The method of claim 21 wherein said step of providing non-volatile memory means further comprises the step of providing non-volatile memory means having a first array containing even addresses of said non-volatile memory means and a second array containing odd addresses of said non-volatile memory means wherein both said first array and said second array of said non-volatile memory means are simultaneously programmed with information.

* * * * *